United States Patent
Franke et al.

(10) Patent No.: US 11,320,503 B2
(45) Date of Patent: May 3, 2022

(54) MPI IMAGING DEVICE, METHOD FOR GENERATING A MAGNETIC FIELD WITH A GRADIENT AND A FIELD-FREE LINE BY MEANS OF AN MPI IMAGING DEVICE

(71) Applicant: Bruker BioSpin MRI GmbH, Ettlingen (DE)

(72) Inventors: Jochen Franke, Karlsruhe (DE); Volker Niemann, Ispringen (DE)

(*) Notice: Subject to any disclaimer, the term of this patent is extended or adjusted under 35 U.S.C. 154(b) by 0 days.

(21) Appl. No.: 17/168,929

(22) Filed: Feb. 5, 2021

(65) Prior Publication Data

US 2021/0255263 A1   Aug. 19, 2021

(30) Foreign Application Priority Data

Feb. 19, 2020 (DE) .................. 10 2020 202 097.3

(51) Int. Cl.
  *G01R 33/383* (2006.01)
  *G01R 33/44* (2006.01)
  *G01R 33/483* (2006.01)

(52) U.S. Cl.
  CPC ......... *G01R 33/383* (2013.01); *G01R 33/445* (2013.01); *G01R 33/4831* (2013.01)

(58) Field of Classification Search
  CPC ............... G01R 33/383; G01R 33/445; G01R 33/4831; G01R 33/4808; G01R 33/3875; G01R 33/381; G01R 33/1276; G01R 33/38
  See application file for complete search history.

(56) References Cited

U.S. PATENT DOCUMENTS

| 4,355,236 A | 10/1982 | Holsinger |
| 10,656,224 B2 | 5/2020 | Buzug et al. |
| 2015/0177343 A1 | 6/2015 | Wald et al. |
| 2016/0216353 A1* | 7/2016 | Heinen ............... G01R 33/5601 |

(Continued)

FOREIGN PATENT DOCUMENTS

| DE | 102015218122 B3 | 9/2016 |
| EP | 1876462 A1 | 1/2008 |

(Continued)

OTHER PUBLICATIONS

Bagheri et al., "A mechanically driven magnetic particle imaging scanner" Appl. Phys. Lett. 113, 183703 (2018).

*Primary Examiner* — G. M. A Hyder
(74) *Attorney, Agent, or Firm* — Benoit & Côté Inc.

(57) ABSTRACT

An MPI imaging device for mapping an object to be examined in a sample volume, with a magnet arrangement which is designed to generate an MPI magnetic field with a gradient B1 and a field-free line in the sample volume, the magnet arrangement comprising a first pair of magnet rings with two magnet rings in a Halbach dipole configuration, which are arranged coaxially on a common Z axis that runs through the sample volume, wherein the magnet arrangement comprises a second pair of magnet rings with two further magnet rings in a Halbach dipole configuration, which is arranged coaxially in relation to the first pair of magnet rings, the magnet rings of both pairs being arranged rotatably with respect to one another about the Z axis. As a result, a variable MPI selection field can be generated by means of permanent magnets.

15 Claims, 9 Drawing Sheets

(56) References Cited

U.S. PATENT DOCUMENTS

| | | | |
|---|---|---|---|
| 2018/0206757 A1* | 7/2018 | Goodwill | A61B 5/0515 |
| 2020/0166591 A1* | 5/2020 | Pietig | H01F 7/0278 |
| 2021/0116525 A1* | 4/2021 | Franke | A61B 5/0515 |

FOREIGN PATENT DOCUMENTS

| | | |
|---|---|---|
| EP | 2957220 A1 | 12/2015 |
| WO | 2017083849 A1 | 5/2017 |

* cited by examiner

MPI IMAGING DEVICE, METHOD FOR GENERATING A MAGNETIC FIELD WITH A GRADIENT AND A FIELD-FREE LINE BY MEANS OF AN MPI IMAGING DEVICE

BACKGROUND OF THE INVENTION

Field of the Invention

The invention relates to an MPI imaging device for mapping an object to be examined in a sample volume, with a magnet arrangement which is designed to generate an MPI magnetic field with a gradient B1 and a field-free line in the sample volume, the magnet arrangement comprising a pair of magnet rings with two magnet rings in a Halbach dipole configuration, which are arranged coaxially on a common Z axis that runs through the sample volume. The invention also relates to a method for generating a magnetic field with a gradient and a field-free line in a sample volume by means of an MPI imaging device.

Description of the Related Art

In magnetic particle imaging (MPI), local concentrations of magnetizable nanoparticles are ascertained in the interior of an object. These nanoparticles are periodically magnetized by an MPI excitation field (drive field) that is variable periodically with a predetermined frequency. For the spatial encoding, the excitation magnetic field is superposed with a time-constant selection magnetic field which has a field-free region. Proceeding from this field-free region, the selection magnetic field increases quickly, so that magnetizable nanoparticles already reach magnetic saturation at a small distance from the field-free region. Therefore, the MPI measurement signal originates from the local surroundings of the field-free region and provides information about the local particle concentration present there. Thus, a magnetic field with a gradient B1 and a field-free region must be made available for MPI measurements.

It is known from the prior art to generate magnetic fields for spectroscopic and mapping methods by means of permanent magnets:

European patent application EP 1876 462 A1 discloses, for example, a magnet system for generating a homogeneous magnetic field for electron spin resonance measurements. The magnet system has a number of stacks of rings which are mounted rotatably with respect to one another and have magnetic areas. The distribution of the magnetic field can be varied by rotating the rings with respect to one another.

In international patent application WO 2017/083849 A1, used as a means for generating a main magnetic field required for MRI are, inter alia, permanent magnets in a Halbach configuration. In the case of a Halbach ring, the magnetization direction of the lateral surface of the ring has a continuous rotation along the lateral profile in the plane perpendicular to the axis of the ring, the magnetization direction returning to its initial value after one revolution of the entire lateral surface of the ring.

The use of Halbach rings is also known for generating magnetic fields for the focusing of particle beams in storage rings. The device disclosed in U.S. Pat. No. 4,355,236 comprises for this a number of Halbach rings that can be rotated with respect to one another.

An MPI selection magnetic field cannot however be generated by the devices disclosed in the aforementioned patent documents.

Bagheri et al., *A mechanically driven magnetic particle imaging scanner* Appl. Phys. Lett. 113 (2018) discloses an MPI scanner in which a selection field with a field-free point is generated by means of ring magnets and, in addition, Halbach arrays are used in order to shift radially the field-free point generated by means of the ring magnets. This allows currentless generation and shifting of a field-free point. However, it does not allow variation of the selection field, in particular the size and shape of the field-free point.

German patent application DE 10 2015 218 122 B3 describes the use of Halbach rings for generating an MPI selection magnetic field. By rotation of the magnet arrangement consisting of two Halbach rings about an axis, a field-free line can be generated and rotated in a scanning plane. The absolute magnitude of the gradient is not variable. In addition, the field strength of the selection field, which determines the sharpness of the field-free line, cannot be adapted in the method described.

SUMMARY OF THE INVENTION

The present invention provides a MPI imaging device that allows more variable generation of an MPI selection field by means of permanent magnets. The magnet arrangement comprises a first pair of magnet rings in a Halbach dipole configuration, which are arranged coaxially on a common Z axis that runs through the sample volume, and further comprises a second pair of magnet rings in a Halbach dipole configuration, which is arranged coaxially in relation to the first pair of magnet rings, the magnet rings being arranged rotatably with respect to one another about the Z axis. Both the first pair of magnet rings and the second pair of magnet rings are preferably arranged mirror-symmetrically in relation to the XY plane.

The MPI imaging device according to the invention therefore comprises two pairs of magnet rings with in each case two magnet rings in a Halbach dipole configuration, which are arranged coaxially on a common Z axis that runs through the sample volume. In practice, these take the form of discrete magnet segments, which have a magnetization varying gradually with the angle. Each magnet ring has a magnetization with a dipole magnetization direction that corresponds to the direction of the magnetic field in the interior of the magnet ring. The dipole magnetization direction of each magnet ring extends perpendicularly to the Z axis (that is to say in the XY plane). A "magnet ring" is taken to refer also to a cylindrical magnetic object of a height smaller than the outer diameter.

According to the invention, the magnet rings are arranged rotatably with respect to one another about the Z axis and can be rotated about the Z axis individually (in a mechanically decoupled manner). The coaxially arranged magnet rings can be brought into different configurations (different angular positions of the dipole magnetization directions of the two magnet rings) by being rotated with respect to one another about the common axis.

The first pair of magnet rings is preferably used to generate a field-free line orthogonally to the Z axis. This can be achieved by using, within the first pair of magnet rings, magnet rings that are constructionally identical in terms of dimensioning and magnetization, the magnet rings being aligned with respect to one another such that the dipole fields generated by the two magnet rings are opposed. That is to say that the dipole axes of the two magnet rings of the pair of magnet rings are rotated with respect to one another by 180° (antiparallel).

The second pair of magnet rings may be arranged axially or radially outside or inside the first pair of magnet rings (on the basis of the sample volume). The pairs of magnet rings are preferably arranged concentrically in relation to one another, that is to say, they have a common central axis.

The first pair of magnet rings and the second pair of magnet rings are rotatable with respect to one another about the Z axis by at least 180°, preferably by n·180°. Preferably, the rings within a pair of rings and/or the pairs of rings are continuously rotatable with respect to one another.

The magnet rings of the two pairs of magnet rings are arranged symmetrically in relation to the same plane of symmetry (XY plane). Each pair of magnet rings generates a magnetic field. Superposing the magnetic fields of all the magnet rings produces the MPI magnetic field. Preferably, the magnet rings within a pair of magnet rings are substantially constructionally identical in terms of dimensioning and magnetization, so that they generate a magnetic dipole field of the same absolute magnitude as the other magnet ring respectively of the corresponding pair of magnet rings. In a special embodiment, the magnet rings of the first pair of magnet rings can generate magnetic fields of the same absolute magnitude as the magnet rings of the second pair of magnet rings. On account of the different distances between the magnet rings within the different pairs of magnet rings, the magnet rings of the first pair of magnet rings are then generally not constructionally identical to those of the second pair of magnet rings. In particular, the inner diameter, the outer diameter and also the ring thicknesses of the rings of the first pair of magnet rings may differ from those of the second pair of magnet rings.

The magnet arrangement defines a rotating coordinate system X'Y'Z, which rotates about the Z axis. As described above, at least in the first pair of magnet rings, the dipole magnetization directions of the two magnet rings are opposed. As a result, a magnetic field with a field-free line, which can be used as an MPI selection field, is generated. One of the magnet rings of the first pair of magnet rings defines the X' direction. The dipole magnetization direction of the other magnet ring of the first pair of magnet rings is then correspondingly aligned in the –X' direction. The field-free line generated by the first pair of magnet rings is aligned in the Y' direction (longitudinal extent of the field-free line in the Y' direction).

Depending on the angular position with respect to the first pair of magnet rings, the second pair of magnet rings can then serve for increasing or reducing the gradient of the magnetic field generated by the first pair of magnet rings or for generating a field-free line deviating from the field-free line generated by the first pair of magnet rings, for example by shifting the field-free line generated by the first pair of magnet rings (second pair of magnet rings as a shift-field system). In this way, selection fields can be generated with different gradients and field-free lines.

In a preferred embodiment of the MPI imaging device, the magnet rings within the pair of magnet rings can be mechanically coupled, so that the first pair of magnet rings and the second pair of magnet rings are rotatable with respect to one another about the Z axis. By rotating the pairs of magnet rings with respect to one another, it is then possible for example to vary the strength of the gradient, the size/shape and the position of the field-free line. The coupling of the two magnet rings within a pair of magnet rings makes it particularly easy for this to be accomplished.

A special embodiment provides that all of the magnet rings of the magnet arrangement can be mechanically coupled, so that the magnet arrangement as a whole is rotatable about the Z axis. Co-rotation of the magnet rings allows the field-free line to be rotated within a sensitive/reconstructed imaging region (field of view—FoV). This rotation may take place discretely or continuously with a rotation frequency in the range of DC-100 Hz to DC-200 Hz and is used for recording different projection angles. Co-rotation of the magnet rings and simultaneous advancement of the object to be examined allows a helical scan to be recorded.

The MPI imaging device according to the invention preferably comprises an MPI excitation coil system for generating at least one excitation magnetic field. The excitation coil system moves the field-free line through the sample volume with an excitation frequency f1. The MPI excitation coil system is preferably operated in an electrically resonant manner with an excitation frequency in the range of 1 kHz to 300 kHz.

The MPI excitation coil system is preferably a mechanically static excitation coil system (that is to say an excitation coil system that is not rotated or shifted within the device), which is set up to generate a magnetic field with a field direction in the direction of the Z axis. As an alternative to an excitation coil system which generates a magnetic field with a field direction in the direction of the Z axis, it is also possible to use an excitation coil system which is set up to generate a magnetic field with a field direction orthogonal to the extent of the field-free line (for example in the X' direction). However, when there is rotation of the pair of magnet rings, such an excitation coil system would have to be rotated along with them, and therefore would have to have corresponding means for this. Preferably, transmit-receive coils are used as the MPI excitation coil system, so that measurement signals can also be received by the excitation system. Alternatively, dedicated excitation and receiver coil systems may also be used. The excitation coil system and receiver coil system are in each case preferably arranged axially between the magnet rings of the first pair of magnet rings.

A preferred embodiment of the MPI imaging device according to the invention provides that the device comprises a shift-field coil system (focus field), which is set up to shift the field-free line at least along one spatial direction, preferably along all spatial directions, quasi-statically (i.e., in discrete steps) or with a shift frequency (i.e., in the continuous-wave (CW) mode) within the sample volume. This is advantageous for the following reason: the field-free line is the sensitive area from which MPI signals can be received. If this area is driven with a high frequency by the excitation field (drive field), the tracers (for example superparamagnetic iron oxide particles) situated in the FoV are excited. The projections of the tracer distribution can be measured along the field-free line. For the MPI imaging, projections must be determined for a large number of angular settings of the magnet arrangement about the Z axis over the entire FoV. In the case of a magnetic field with a strong gradient B1, this is not feasible by an MPI excitation coil system on its own, because otherwise the amplitude of the drive field generated by the excitation coil system would have to be very large; this is accompanied however by adverse effects on the object to be examined, since high amplitudes may lead to peripheral nerve stimulation (PNS), for example nerve twitching or the like, or this leads to tissue heating by way of the so-called specific absorption rate (SAR). The shift field brings about an offset of the field-free line, preferably in the excitation direction; as a result, it is possible to reduce the required drive field amplitude of the excitation field. The shift of the field-free line by the shift-field coil system takes place in steps (discretely) or with a shift frequency f2, which is less than the excitation frequency f1 (in particular f2=DC–5 kHz), so that an excitation scan can be carried out by means of the excitation coil system at each shift brought about by the shift field. Preferably, the shift-field magnetic coil system is designed such that a shift takes place perpendicularly to the longitudinal extent of the field-free line.

In a special embodiment of the MPI imaging device according to the invention, the MPI imaging device is set up to be operated in an MPI mode and in at least one further imaging mode. In the MPI mode, the magnet rings of the pair of magnet rings have an antiparallel dipole magnetization direction, as described above.

In a particularly preferred embodiment of the MPI imaging device according to the invention, the further imaging mode is an MRI mode for recording magnetic resonance imaging images, the magnet arrangement being designed to generate in the MRI mode a B0 field with a B0 isocenter, suitable for MRI measurements, by the dipole magnetization directions of the magnet rings within the pair of magnet rings being aligned parallel to the XY plane in the MRI mode. For this purpose, the magnet rings of at least one of the two pairs of magnet rings must be rotatable with respect to one another about the Z axis. In the MRI mode, the dipole magnetization directions of the magnet rings of the magnet arrangement are aligned mirror-symmetrically in relation to the XY plane (which extends through the center of the magnet arrangement).

In a preferred embodiment, the first pair of magnet rings and the second pair of magnet rings have in each case parallel-aligned dipole magnetization directions, the amplitude of the B0 field being variable by rotating one of the two pairs of magnet rings in relation to one another. The B0 field is dictated by the first pair of magnet rings, when the two rings are aligned parallel in their field direction. By rotating the second pair of magnet rings with respect to the first pair of magnet rings, a change of the amplitude of the B0 field is possible, in particular if a pair of magnet rings with a weaker field strength is rotated. Consequently, B0 remains constant in its direction, but not in its amplitude. A precondition for this is that the dipole magnetization directions of the magnet rings of the first pair of magnet rings and of the second pair of magnet rings are in each case the same, though the second pair of magnet rings altogether is rotated with respect to the first pair of magnet rings. As a result of the rotatability of the individual rings with respect to one another, it is possible to influence the type of the magnetic field (homogeneous magnetic field, magnetic field gradient).

A further embodiment of the MPI imaging device according to the invention provides that the further imaging mode is a CT mode for recording computed tomography images, the magnet rings of the pair of magnet rings being kept at a distance from one another in the Z direction and the device comprising a CT unit with an x-ray source and an x-ray detector opposite the x-ray source, the x-ray source and x-ray detector being mounted in the XY plane in a manner rotatable about the Z axis. The CT unit is axially arranged between the magnet rings of the pair of magnet rings and in the CT mode rotates about the Z axis. Preferably, the x-ray source and the x-ray detector can be mechanically coupled to the magnet arrangement in such a way that the CT unit is rotatable about the Z axis together with the magnet arrangement. Coupling the rotation of the magnet arrangement and the rotation of the CT unit can reduce the problem of stray fields that arises on account of a changing magnetic field (induced by a relative movement between the magnetic field arrangement and the CT unit) through which the electron beam of the CT unit would otherwise move. The static stray field of the magnetic field arrangement can be directly compensated, or taken into account, so that the electron beam accurately impinges on the anode material.

Optionally, the hybrid imaging device according to the invention is set up to be operated in more than two imaging modes, for example MPI, MRI and CT.

The invention also relates to a method for generating a magnetic field with a gradient B1 and a field-free line in a sample volume by means of an MPI imaging device as described above, the magnet rings of the first pair of magnet rings being aligned with respect to one another such that they have antiparallel dipole magnetization directions. In other words, the dipole axes (dipole magnetization directions) of the two magnet rings of the first pair of magnet rings are rotated with respect to one another by 180° (antiparallel dipole magnetization directions). Consequently, a field-free line is generated orthogonally to the Z axis by the first pair of magnet rings.

An advantageous variant of the method according to the invention provides that the magnet rings of the second pair of magnet rings are aligned with respect to one another such that they have parallel dipole magnetization directions. The second pair of magnet rings consequently generates a homogeneous magnetic field.

A development of this variant (with parallel dipole magnetization directions of the second pair of magnet rings) provides that the dipole magnetization directions of the magnet rings of the second pair of magnet rings are aligned parallel to the dipole magnetization direction of one of the magnet rings of the first pair of magnet rings. The second pair of magnet rings consequently generates a shift field, with which the field-free line generated by the first pair of magnet rings can be shifted along the Z axis within the sample volume. The shift field is required in particular whenever the gradient of the selection field is great. The generation of a shift field and the accompanying offset of the field-free line, preferably in the excitation direction, allows the required drive-field amplitude of the excitation field to be reduced. The shift of the field-free line by the shift field takes place in steps (discretely) or with a shift frequency f2, which is less than the excitation frequency f1, so that an excitation scan can be carried out by means of the excitation coil system at each shift brought about by the shift field. As described above, it is advantageous if the shift of the field-free line takes place perpendicularly to the longitudinal extent of the field-free line. This is achieved by the second pair of magnet coils generating a field with a field direction in the X' direction.

As an alternative to this, in the variant with parallel dipole magnetization directions of the second pair of magnet rings, the pairs of magnet rings are aligned with respect to one another such that the dipole magnetization directions of the magnet rings of the second pair of magnet rings include an angle of $0°<\alpha<180°$ with the dipole magnetization directions of the magnet rings of the first pair of magnet rings.

With $\alpha=90°$ (homogeneous magnetic field in the direction of the longitudinal extent of the field-free line), a saturation of the entire FoV can consequently be achieved.

In another variant of the method according to the invention, it is provided that the magnet rings of the second pair of magnet rings are aligned with respect to one another such that they have antiparallel dipole magnetization directions.

In particular, the pairs of magnet rings may be aligned with respect to one another such that the dipole magnetization directions of the magnet rings of the second pair of magnet rings are aligned parallel to the dipole magnetization directions of the magnet rings of the first pair of magnet rings (that is to say right-hand magnet rings with parallel dipole magnetization directions and left-hand magnet rings with parallel dipole magnetization directions opposite to the right-hand magnet rings) or are aligned antiparallel. In this way, the gradient of the magnetic field generated by the first pair of magnet rings can be strengthened or weakened. The field-free line of the entire arrangement is obtained by superposing the field-free lines of the magnetic fields generated by the two pairs of magnet rings.

As an alternative to this, the dipole magnetization directions of the magnet rings of the second pair of magnet rings may include an angle of $0°<\alpha<180°$ with the dipole magnetization directions of the magnet rings of the first pair of magnet rings. In this case, the dipole magnetizations of the magnet rings of the two pairs of magnet rings are aligned obliquely in relation to one another. This produces (as compared with the field-free line generated by the first pair of magnet rings) a field-free line with a changed gradient strength, rotated about the Z axis.

According to the invention, the magnet rings may be rotated about the Z axis simultaneously (in a mechanically coupled manner) or individually (in a mechanically decoupled manner). A mechanically coupled rotation allows a mechanical rotation of the field-free line for an MPI mode and a rotation of the B0 field direction for an MRI mode. A mechanically decoupled rotation allows the configuration of the magnet rings to be changed (switching over from MRI mode to MPI mode and vice versa). By adaptations of the magnet ring parameters (distance between rings, inner and outer diameter, ring thickness, ring material, ring segmentation, segment magnetization directions, ring adjustment angle, . . . ), it is possible to optimize the B0-field homogeneity and/or B1-gradient linearity and the rest position of the field-free line. On account of the distance between the magnet rings, it is possible to allow further examination processes, such as for example CT or optical methods, at the same location and, where applicable, simultaneously. Consequently, an object can be measured by all modalities at the same location without the sample having to be transported.

Further advantages of the invention are apparent from the description and the drawings. The aforementioned features and the features mentioned further below can likewise be used according to the invention in each case by themselves or together in any desired combinations. The embodiments shown and described should not be understood as an exhaustive list, but rather have an exemplary character for the purpose of illustrating the invention.

DETAILED DESCRIPTION

Figure 1:
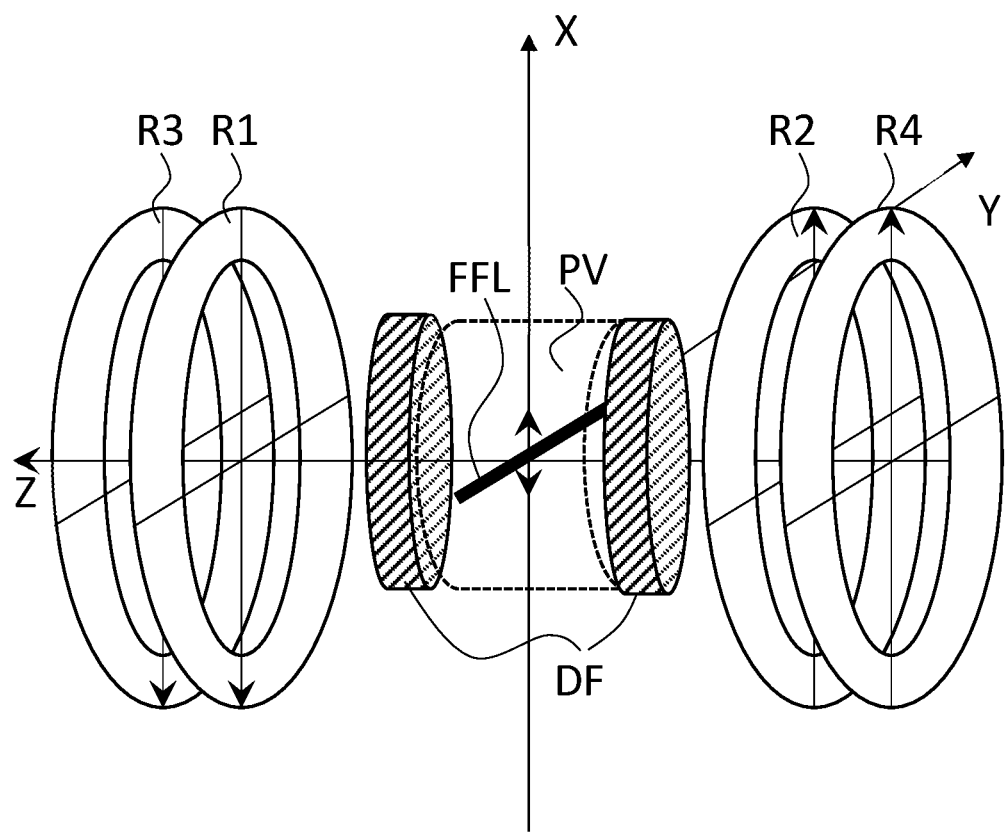
FIG. 1 shows a magnet arrangement of an imaging device according to the invention, arranged around an MPI excitation coil system, with two pairs of magnet rings in a position for generating an MPI magnetic field with a field-free line with a strong field gradient in the X and Z directions.

FIG. 1 shows a magnet arrangement for an imaging device according to the invention. The magnet arrangement shown in FIG. 1 comprises two magnet rings R1, R2, which form a first pair of magnet rings R1/R2. The magnet rings R1, R2 are second-order Halbach rings (k=2, directed dipole moment). The two magnet rings R1, R2 are arranged coaxially in relation to a Z axis and symmetrically around a sample volume PV, through which the Z axis runs. The sample volume PV is defined by the freely accessible bore (tube diameter).

In the case of the magnet arrangement according to the invention, in addition to the first pair of magnet rings R1/R2 there is a second pair of magnet rings R3/R4 with two further magnet rings R3, R4. The two pairs of magnet rings R1/R2, R3/R4 are arranged coaxially in relation to the Z axis, the first pair of magnet rings R1/R2 being closer to the center of the sample volume PV than the second pair of magnet rings R3/R4 in the example shown in FIG. 1. The magnet rings R3, R4 of the second pair of magnet rings R3/R4, preferably the magnet rings R1, R2, R3, R4 of both pairs of magnet rings R1/R2, R3/R4, are individually rotatable with respect to one another. In addition, the magnet rings R1, R2, R3, R4 within each pair of magnet rings R1/R2, R3/R4 can be coupled, so that the first pair of magnetic rings R1/R2 are rotated with respect to the second pair of magnet rings R3/R4 without the magnet rings R1, R2, R3, R4 of the respective pair of magnet rings R1/R2, R3/R4 being rotated with respect to one another. Furthermore, all of the magnet rings R1, R2, R3, R4 can be coupled together, so that all of the magnet rings R1, R2, R3, R4 can be rotated together.

In the setup shown in FIG. 1, the dipole magnetization directions of the magnet rings R1, R2, R3, R4 within each pair of magnet rings R1/R2, R3/R4 are aligned antiparallel to one another, the right-hand magnet rings R2, R4 of the two pairs of magnet rings R1/R2, R3/R4 having a dipole magnetization direction in the X direction and the left-hand magnet rings R1, R3 having a dipole magnetization direction in the −X direction. The field gradients in the X and Z directions are identical. In the Y direction, the field gradient is 0. This produces a magnetic field with a field-free line FFL and a strong magnetic field gradient B1.

Figure 2:
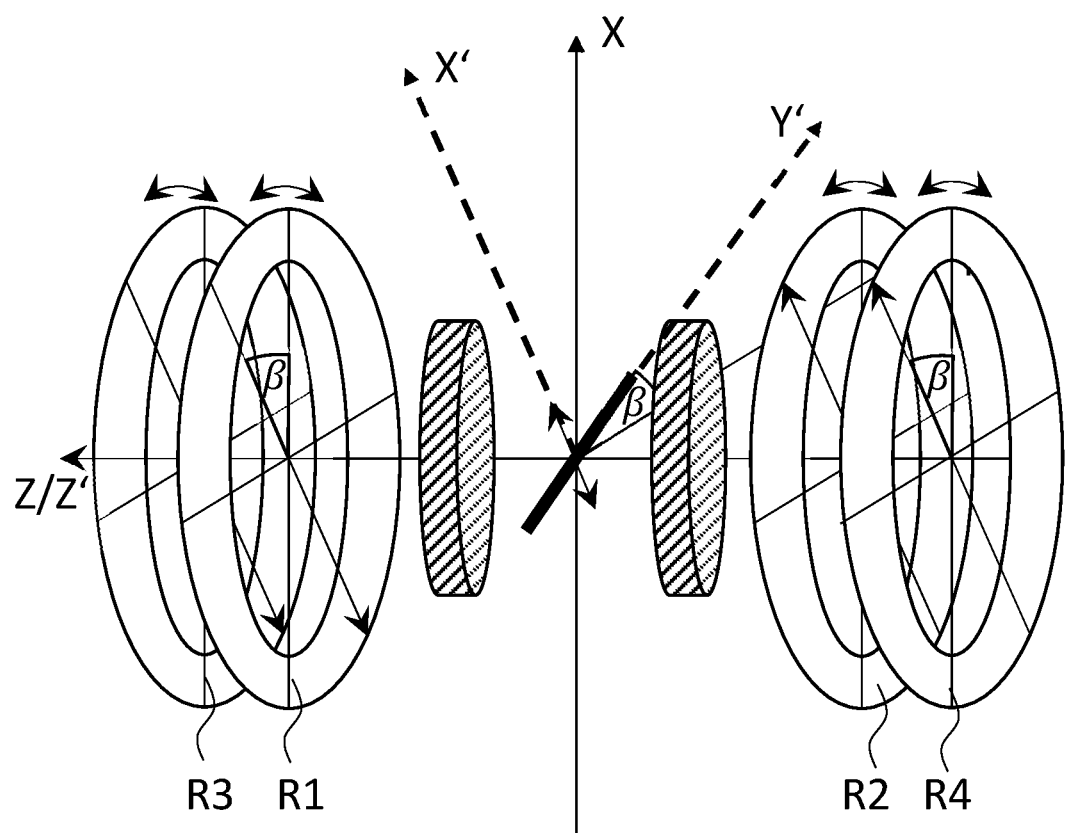
FIG. 2 shows a magnet arrangement of an imaging device according to the invention, arranged around an MPI excitation coil system, with two pairs of magnet rings in a position for generating an MPI magnetic field with a field-free line with a strong field gradient in the X' direction.

In FIG. 1, the dipole magnetization directions of the two magnet rings R1, R2 point in the −X direction of a Cartesian coordinate system XYZ. A co-rotation by the angle β of all of the magnet rings R1, R2, R3, R4 about the common axis of rotation Z results in a rotation of the field-free line FFL, as shown in FIG. 2. A further coordinate system X'Y'Z', defined by the magnet rings R1, R2, R3, R4, is then rotated with respect to the coordinate system XYZ by the angle β, with Z' coinciding with Z. The further coordinate system X'Y'Z' is defined such that the field-free line FFL generated by the pairs of magnetic coils R1/R2, R3/R4 is always aligned in the Y' direction.

By adapting the magnet rings R1, R2, R3, R4 (distance, thickness, material, remanence, position, magnetization, inner and outer diameter), the MPI magnetic field generated by the magnet rings R1, R2, R3, R4 can be optimized with respect to the amplitude (B1) and the gradient linearity (minimizing the odd-numbered field components B3, B5, . . . , Bn).

In order to move the field-free line FFL within the sample volume PV, an MPI excitation coil system DF is provided. Using the MPI excitation coil system DF, homogeneous AC fields can be generated in the kHz range (excitation field=drive field) with the field direction in the Z direction, whereby the field-free line FFL can be moved orthogonally to its position (β+90°) in the XY plane. In this case, the field changes induced by the MPI excitation coil system DF are used for the excitation of magnetic nanoparticles and for the detection of the particle signal (the projection signal along the field-free line). Preferably, two separate coils are used for the particle excitation and for the signal detection. A dedicated receiver coil should in this case be constructed as a gradiometer. The excitation coil system DF shown in FIG. 1 is configured by way of example as a split coil, which allows a combination of the device for example with a CT arrangement. Continuously wound Tx and/or Rx coils are likewise conceivable if no CT unit is to be used.

Figure 3:
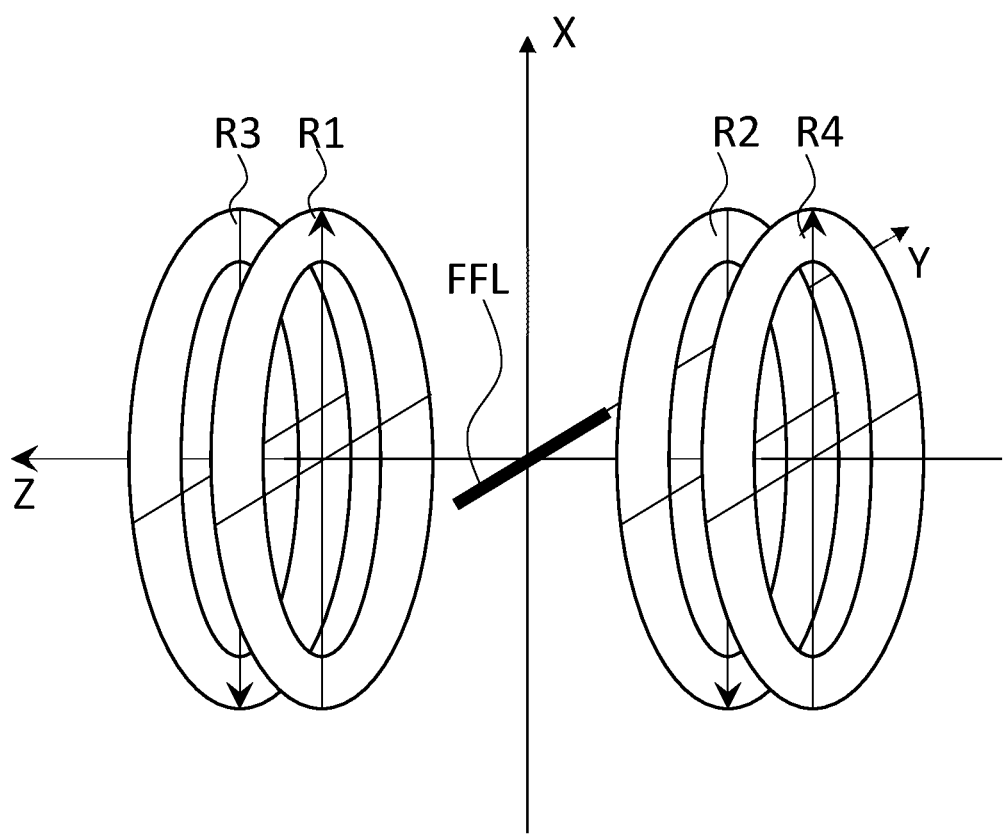
FIG. 3 shows a magnet arrangement of an imaging device according to the invention with two pairs of magnet rings in a position for generating an MPI magnetic field with a field-free line with a weak field gradient.

Then shown are further setups for illustrating how the magnet rings R1, R2, R3, R4 or pairs of magnet rings R1/R2, R3/R4 in the magnet arrangement that can be used for the MPI imaging device according to the invention may be oriented in relation to one another:

In the setup shown in FIG. 3, the dipole magnetization directions of the magnet rings R1, R2, R3, R4 within each pair of magnet rings R1/R2, R3/R4 are aligned antiparallel to one another, the dipole magnetization directions of the right-hand magnet rings R2, R4 of the two pairs of magnet rings R1/R2, R3/R4 being rotated by 180° with respect to one another—in contrast to the setups shown in FIG. 1 and FIG. 2. The same applies to the dipole magnetization directions of the left-hand magnet rings R1, R3 of the two pairs of magnet rings R1/R2, R3/R4. The magnetic fields generated by the individual pairs of magnet rings R1/R2, R3/R4 therefore weaken one another. This produces a magnetic field with a field-free line FFL and a weak magnetic field gradient B1.

Figure 4:
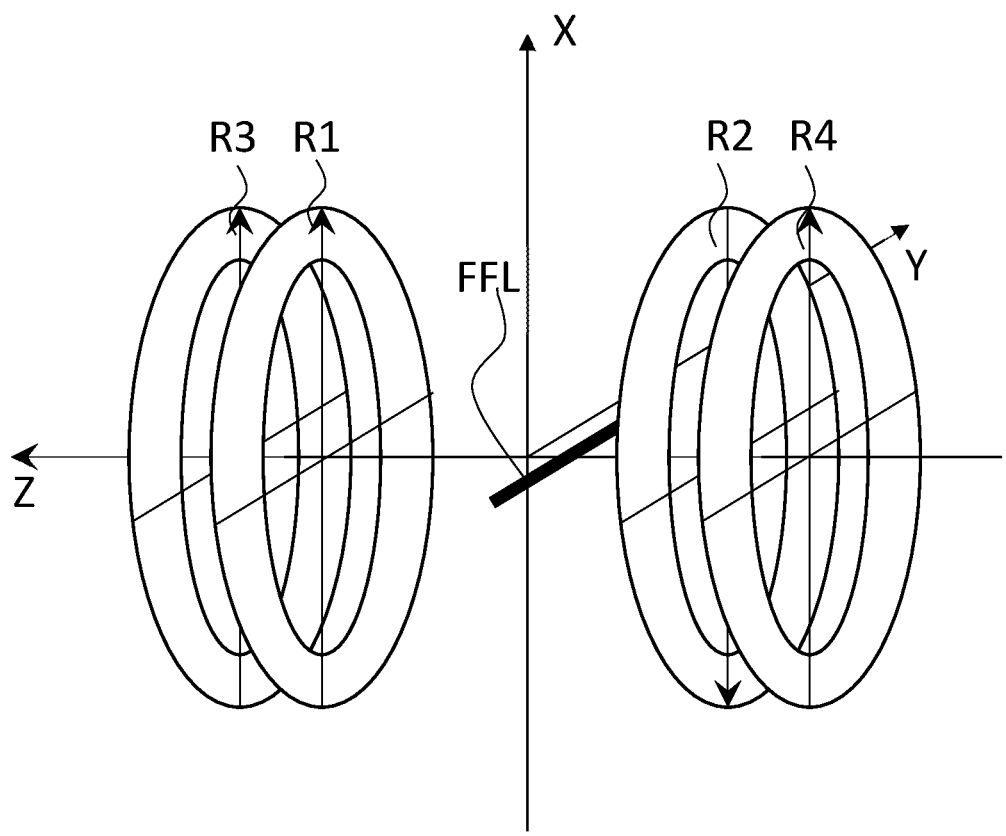
FIG. 4 shows a magnet arrangement of an imaging device according to the invention with two pairs of magnet rings for generating an MPI magnetic field with a field-free line in a position in which the second pair of magnet rings acts as a shift-field system.

Also in the setup shown in FIG. 4, the dipole magnetization directions of the magnet rings R1, R2 of the first pair of magnet rings R1/R2 are aligned antiparallel to one another, and consequently generate a field-free line along the Y axis (not shown in FIG. 4). On the other hand, the magnet rings R3, R4 of the second pair of magnet rings R3/R4 are not rotated with respect to one another, so that their dipole magnetization directions are aligned parallel to one another, to be precise in the dipole magnetization direction of the magnet ring R1. The second pair of magnet rings R3/R4 consequently generates a homogeneous magnetic field in the X direction, which brings about an offset of the field-free line and is referred to as the shift field. By superposing the magnetic fields generated by the two pairs of magnet rings, a field-free line FFL shifted in the −Z direction is produced, as represented in FIG. 4.

Figure 5:
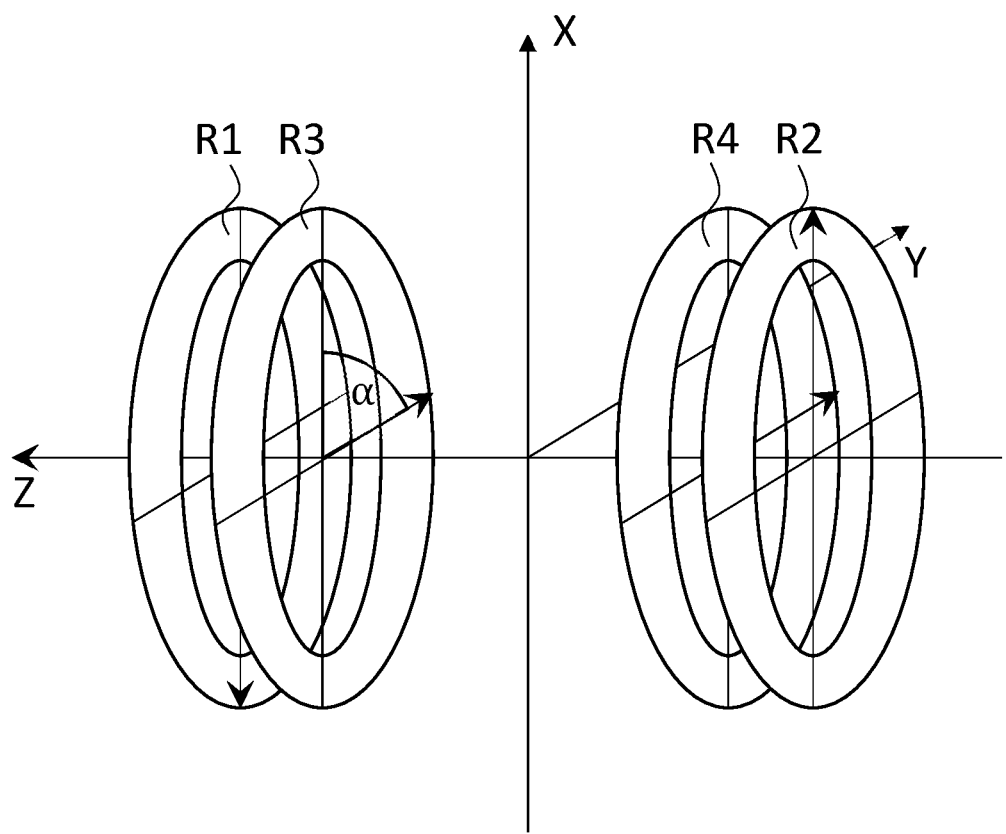
FIG. 5 shows a magnet arrangement of an imaging device according to the invention with two pairs of magnet rings in a position in which the second pair of magnet rings serves for saturating the sample in the FoV.

In the setup shown in FIG. 5, the first pair of magnet rings R1/R2, with dipole magnetization directions aligned antiparallel, are arranged axially outside the second pair of magnet rings R3/R4. The first pair of magnet rings R1/R2 generates a field-free line along the Y axis (not shown in FIG. 5). On the other hand, the magnet rings R3, R4 of the second pair of magnet rings R3/R4 are not rotated with respect to one another, so that their dipole magnetization directions are aligned parallel to one another, but in contrast to the setup shown in FIG. 3 not in the dipole magnetization direction of one of the magnet rings R1, R2 of the other pair of magnet rings R1, R2, but rotated by an angle α (here: 90°) with respect to the dipole magnetization direction of the magnet ring R2. The second pair of magnet rings R3, R4 therefore generates a homogeneous magnetic field (shift field) in the Y direction. The superposing of the magnetic fields generated by the two pairs of magnet rings R1/R2, R3/R4 leads to the field-free line FFL being eliminated. This can be used for saturating the entire FoV (here: the XY plane). On account of the saturation of the sample in the FoV generated by the two pairs of magnet rings R1/R2, R3/R4, the sample does not contribute to the signal in an MPI measurement carried out in this way, so that a background signal for a background correction can be determined without the sample having to be removed from the FoV for this purpose.

Figure 6:
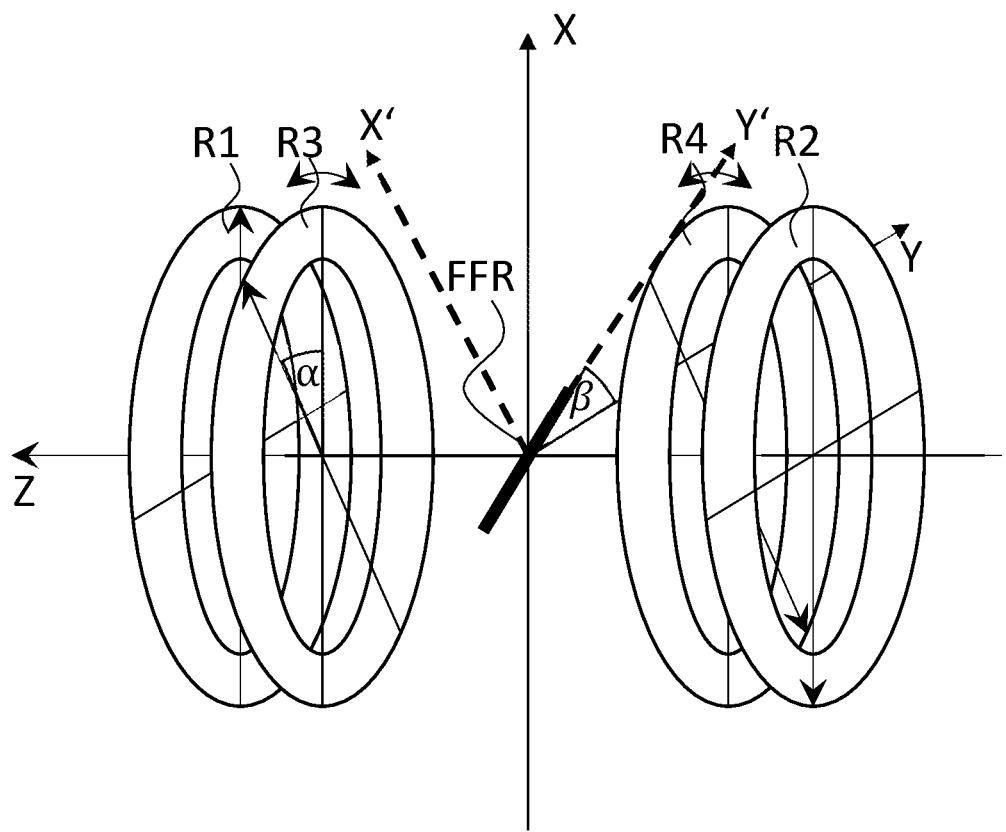
FIG. 6 shows a magnet arrangement of an imaging device according to the invention with two pairs of magnet rings in a position for generating an MPI magnetic field with a rotated field-free line and a changed gradient strength.

FIG. 6 shows a setup with which the field-free line can be rotated in the X/Y plane. For this purpose, the dipole magnetization directions of the magnet rings R1, R2 and R3, R4 within each pair of magnet rings R1/R2, R3/R4 are aligned antiparallel to one another, the dipole magnetization directions of the magnet rings R1, R2 of the first pair of magnet rings R1/R2 being rotated with respect to the dipole magnetization directions of the magnet rings R3, R4 of the second pair of magnet rings R3/R4 by an angle α. Both pairs of magnet rings R1/R2, R3/R4 respectively generate a field-free line, which are rotated by the angle α with respect to one another (not shown). The superposing of the magnetic fields generated by the two pairs of magnet rings R1/R2, R3/R4 produces a rotation of the field-free line FFL about the Z axis. When there is a rotation of the two gradient fields, a field-free line FFL persists, but the gradient strength is varied in terms of its absolute value and the position in the XY plane is also varied. Depending on the strength of the respective rings, the longitudinal extent of the field-free line FFL lies between the dipole axes +90°. With the same gradient strength, the longitudinal extent of the field-free line FFL is α/2+90°.

In the case of a setup for α equals 90° (not shown), the superposing of the magnetic fields generated by the two pairs of magnet rings R1/R2, R3/R4 produces a 45° rotation of the field-free line, as long as the two pairs of magnet rings have the same magnetic field strength.

Figure 7:
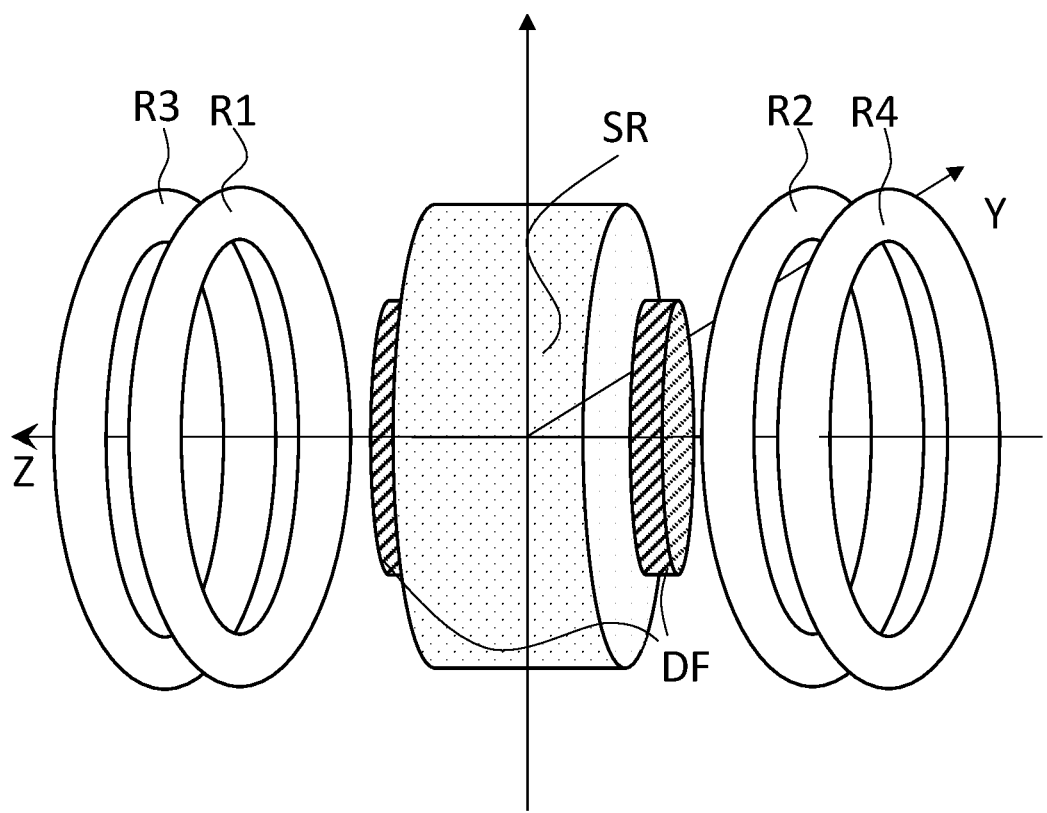
FIG. 7 shows an MPI imaging device according to the invention with a magnet arrangement, an MRI shimming device, and also an MRI/MPI excitation coil system.

The embodiment of the MPI imaging device according to the invention that is shown in FIG. 7 can be operated in various imaging modes (here: MRI mode and MPI mode). For this purpose, an MRI shimming device SR and an MPI excitation coil system DF are provided. In contrast to the embodiment shown in FIG. 1, the excitation coil system shown in FIG. 7 is not configured as a split coil. As a result, a greater sensitivity is achieved.

Figure 8:
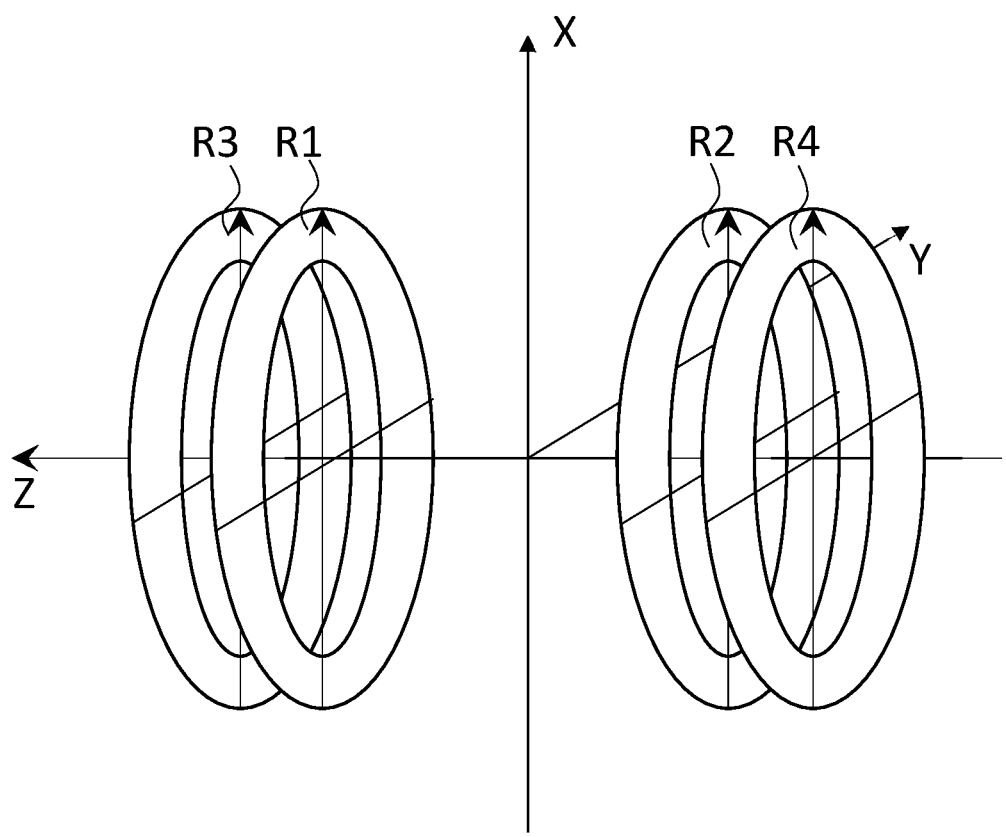
FIG. 8 shows a magnet arrangement of an imaging device according to the invention with two pairs of magnet rings in the MRI mode for generating a strong B0 field.
Figure 9:
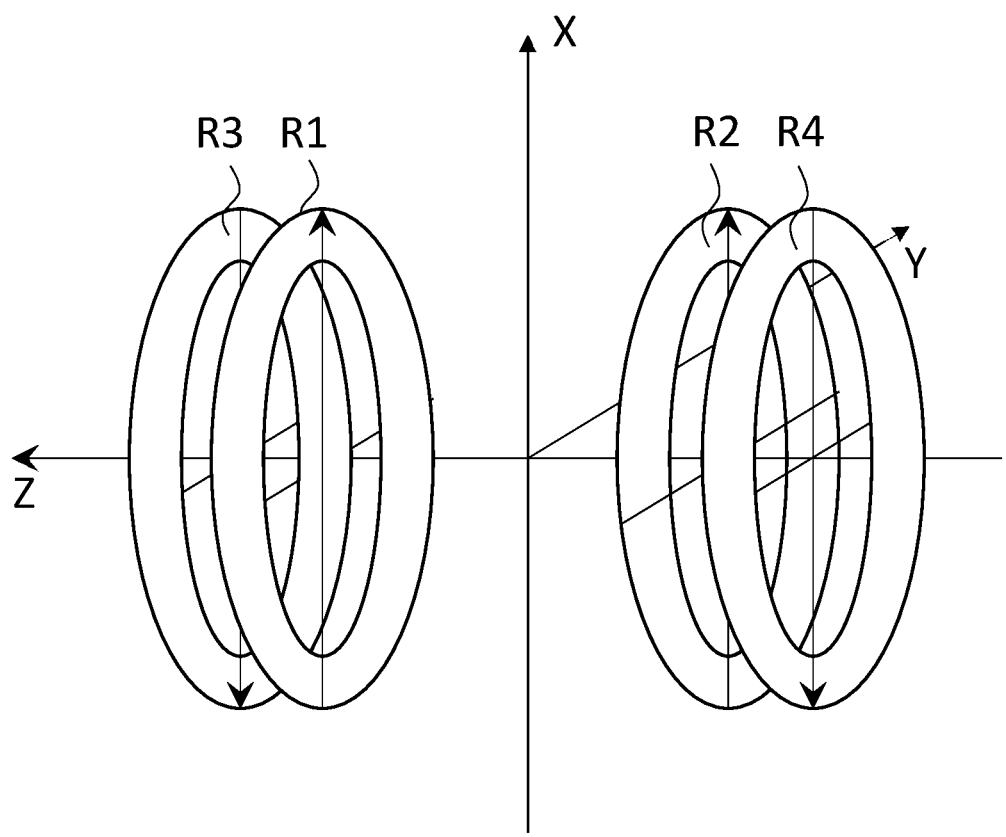
FIG. 9 shows a magnet arrangement of an imaging device according to the invention with two pairs of magnet rings in the MRI mode for generating a weak B0 field.

For the MRI mode, the magnet rings R1, R2, R3, R4 are aligned such that the dipole magnetization directions of the magnet rings R1, R2, R3, R4 are aligned parallel to one another, in order to generate a homogeneous B0 field, suitable for MRI measurements, in the dipole direction (see FIGS. 8 and 9).

Shown in FIG. 8 and in FIG. 9 are two positions of the magnet arrangement according to the invention in which the magnet arrangement can be used for MRI measurements. For this purpose, the magnet rings R1, R2 and R3, R4 of each pair of magnet rings R1/R2, R3/R4 are aligned parallel to one another, so that both pairs of magnet rings R1/R2, R3/R4 generate a homogeneous magnetic field (B0 field) in the dipole magnetization direction.

In FIG. 8, the dipole magnetization directions of all of the magnet rings R1, R2, R3, R4 are aligned in the same direction, so that a high B0 field is produced by the superposing of the fields generated by the two pairs of magnet rings.

In FIG. 9, the dipole magnetization directions of the magnet rings R1, R2 of the first pair of magnet rings R1/R2 are aligned opposite to the dipole magnetization directions of the magnet rings R3, R4 of the second pair of magnet rings R3/R4 (antiparallel), so that a low B0 field is produced by the superposing of the fields generated by the two pairs of magnet rings. Consequently, different B0 strengths can be accomplished in the MRI mode. Choosing the distance between the magnet rings R1, R2 and R3, R4 within the pairs of magnet rings R1/R2, R3/R4 allows a basic homogenization of the magnetic field generated by the magnet arrangement to be achieved.

In addition, the direction of the B0 field can be set by rotating the coupled pairs of rings R1/R2, R3/R4. This allows MRI data to be acquired direction-dependently. For this, however, the MRI shimming device SR (shimming tube and shimming coil system), the MRI excitation coils (not shown) and the gradient coil system (not shown) must be co-rotated.

The invention claimed is:

1. An MPI imaging device for mapping an object to be examined in a sample volume, with a magnet arrangement that generates an MPI magnetic field with a gradient B1 and a field-free line in the sample volume, the magnet arrangement comprising:
   a first pair of magnet rings in a Halbach dipole configuration, which are arranged coaxially on a common Z axis that runs through the sample volume; and
   a second pair of magnet rings in a Halbach dipole configuration, which is arranged coaxially in relation to the first pair of magnet rings, the magnet rings of both pairs being arranged rotatably with respect to one another about the Z axis.

2. The MPI imaging device as claimed in claim 1, wherein the magnet rings of each pair of magnet rings can be mechanically coupled, so that the first pair of magnet rings and the second pair of magnet rings are rotatable with respect to one another about the Z axis.

3. The MPI imaging device as claimed in claim 1, wherein all of the magnet rings of the magnet arrangement can be mechanically coupled, so that the magnet arrangement as a whole is rotatable about the Z axis.

4. The MPI imaging device as claimed in claim 1, further comprising an MPI excitation coil system for generating at least one excitation magnetic field.

5. The MPI imaging device as claimed in claim 1, wherein the device comprises a shift-field coil system, which is set up to shift the field-free line along at least one spatial direction quasi-statically or with a shift frequency within the sample volume.

6. The MPI imaging device as claimed in claim 1, wherein the MPI imaging device is configured to be operated in an MPI mode and in at least one further imaging mode.

7. The MPI imaging device as claimed in claim 6, wherein said further imaging mode is an MRI mode for recording magnetic resonance imaging images, and wherein the magnet arrangement is configured to generate in the MRI mode a B0 field with a B0 isocenter, suitable for MRI measurements, due to dipole magnetization directions of the magnet rings of one of said pairs of magnet rings being aligned parallel to an XY plane perpendicular to the Z axis.

8. The MPI imaging device as claimed in claim 7, wherein the first pair of magnet rings and the second pair of magnet rings each have parallel-aligned dipole magnetization directions, and wherein an amplitude of the B0 field may be varied by rotating the two pairs of magnet rings in relation to one another.

9. A method for generating a magnetic field with a gradient B1 and a field-free line in a sample volume by means of an MPI imaging device as claimed in claim 1, comprising aligning the magnet rings of the first pair of magnet rings with respect to one another such that they have antiparallel dipole magnetization directions.

10. The method as claimed in claim 9, wherein the magnet rings of the second pair of magnet rings are aligned with respect to one another such that they have parallel dipole magnetization directions.

11. The method as claimed in claim 10, wherein the pairs of magnet rings are aligned with respect to one another such that the dipole magnetization directions of the magnet rings of the second pair of magnet rings are aligned parallel to the dipole magnetization direction of one of the magnet rings of the first pair of magnet rings.

12. The method as claimed in claim 10, wherein the pairs of magnet rings are aligned with respect to one another such that the dipole magnetization directions of the magnet rings of the second pair of magnet rings include an angle of $0°<\alpha<180°$ relative to the dipole magnetization directions of the magnet rings of the first pair of magnet rings.

13. The method as claimed in claim 9, wherein the magnet rings of the second pair of magnet rings are aligned with respect to one another such that they have antiparallel dipole magnetization directions.

14. The method as claimed in claim 13, wherein the pairs of magnet rings are aligned with respect to one another such that the dipole magnetization directions of the magnet rings of the second pair of magnet rings are aligned parallel or antiparallel to the dipole magnetization directions of the magnet rings of the first pair of magnet rings.

15. The method as claimed in claim 13, wherein the pairs of magnet rings are aligned with respect to one another such that the dipole magnetization directions of the magnet rings of the second pair of magnet rings include an angle of $0°<\alpha<180°$ relative to the dipole magnetization directions of the magnet rings of the first pair of magnet rings.

* * * * *